United States Patent [19]
Sato et al.

[11] Patent Number: 6,031,291
[45] Date of Patent: *Feb. 29, 2000

[54] COMMON CONTACT HOLE STRUCTURE IN SEMICONDUCTOR DEVICE

[75] Inventors: Norifumi Sato; Takami Hiruma; Hitoshi Mitani; Hidetaka Natsume, all of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/550,159

[22] Filed: Oct. 30, 1995

[30] Foreign Application Priority Data

Oct. 28, 1994 [JP] Japan ................................ 6-265871

[51] Int. Cl.[7] .......................... H01L 23/48; H01L 23/52; H01L 29/40; H01L 29/76
[52] U.S. Cl. .................... 257/774; 257/382; 257/384; 257/768
[58] Field of Search ..................... 257/382, 384, 257/768, 774, 903, 905

[56] References Cited

U.S. PATENT DOCUMENTS

| 3,604,990 | 9/1971 | Sigsbee | 257/312 |
|---|---|---|---|
| 5,346,835 | 9/1994 | Malhi et al. | 437/41 |
| 5,521,416 | 5/1996 | Matsuoka et al. | 257/377 |
| 5,532,516 | 7/1996 | Pasch et al. | 257/752 |
| 5,592,013 | 1/1997 | Honda | 257/392 |

OTHER PUBLICATIONS

Halliday and Resnick, Physics Parts I and II, p. 1023, Dec. 1966.

*Primary Examiner*—Mahshid Saadat
*Assistant Examiner*—Allan R. Wilson

[57] ABSTRACT

A semiconductor device having a semiconductor substrate, an impurity diffused layer formed in a principal surface of the semiconductor substrate, a conductive member formed on the semiconductor substrate adjacent to the impurity diffused layer and having a sloped surface inclined to the principal surface of the semiconductor substrate, an insulator film deposited to cover the impurity diffused layer and the conductive member, and a common contact hole formed through the insulator film to extend over a surface of the impurity diffused layer and the sloped surface of the conductive member.

6 Claims, 10 Drawing Sheets

FIGURE 7F

COMMON CONTACT HOLE STRUCTURE IN SEMICONDUCTOR DEVICE

BACKGROUND OF THE INVENTION

1. Field of the Invention

The present invention relates to a semiconductor device, and more specifically to a contact hole structure in a semiconductor device.

2. Description of Related Art

Semiconductor integrated circuits formed on a semiconductor substrate, and particularly, a silicon semiconductor substrate, are continuously increasing in integration density and in integration scale, particularly, for example, the integrated circuit typified by a SRAM (static random access memory) has increased its integration scale from 1 megabits to 4 megabits and more. In addition, the SRAM is required to have a high operation speed and also to have a low electric consumption.

Furthermore, large scale integrated circuits including SRAMs and DRAMs (dynamic random access memory) are required not only to form on a single chip as many devices as possible, but also to have a chip size as small as possible in view of the cost per-product and the yield of production. Here, the reduction of the chip size depends upon how each memory cell is reduced. In particular, for reduction of memory cell size in an SRAM having a complicated memory cell structure and requiring a fine patterning, it has become important to consider a method for reducing spacing between a contact hole in the memory cell and another semiconductor device pattern. Here, the semiconductor device pattern includes a source/drain diffusion layer pattern for a transistor, a gate electrode pattern for a transistor, a wiring conductor pattern for a power supply, a device isolation insulator pattern, etc.

Under the circumstances mentioned above, how to apply a self-aligned contact hole has been considered, but there is a case in which the self-aligned contact hole cannot be applied. This is a case of forming a contact hole for interconnecting a gate electrode and a diffused layer. In this case, it was a conventional practice to form a contact hole which extends over the gate electrode pattern and the diffused layer. This contact hole will be called a "common contact hole" in this specification.

Figure 1A:
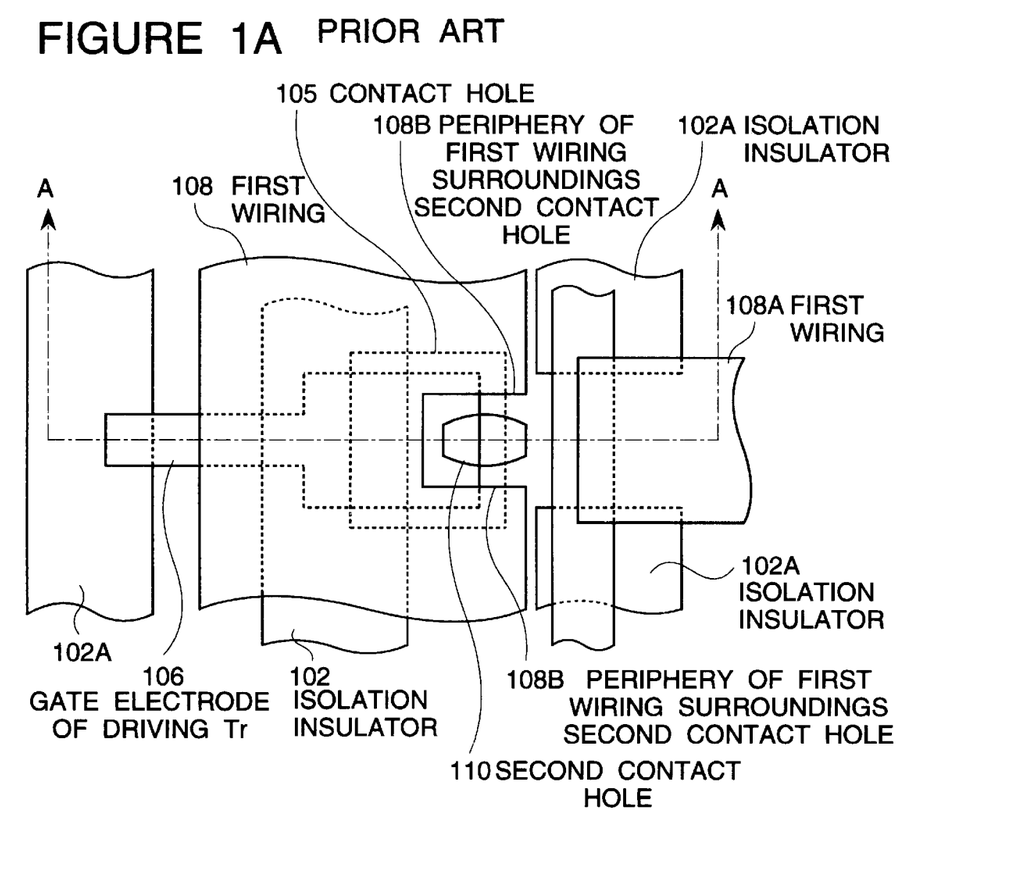
FIG. 1A is a layout pattern diagram illustrating the "common contact hole" which extends over the gate electrode pattern and the diffused layer in the prior art semiconductor device.

Now, this prior art will be explained with reference to FIGS. 1A and 1B. FIG. 1A is a layout pattern diagram illustrating the "common contact hole" which extends over the gate electrode pattern and the diffused layer, and FIG. 1B is a sectional view taken along the line A—A in FIG. 1A.

Figure 1B:
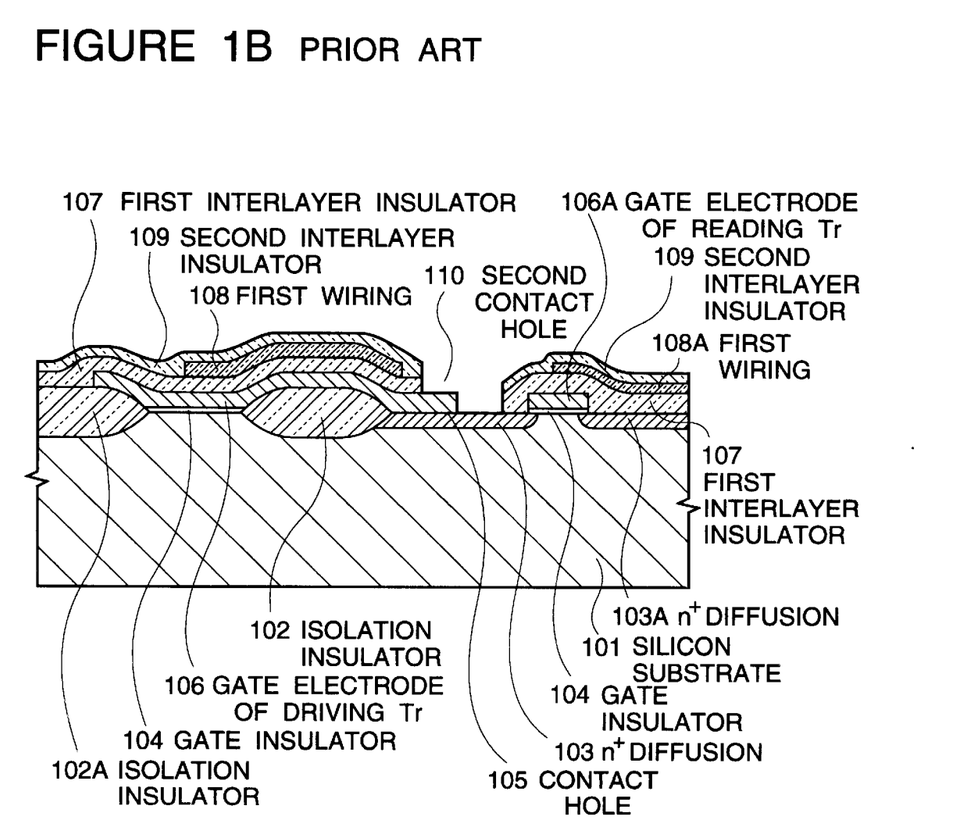
FIG. 1B is a sectional view taken along the line A—A in FIG. 1A.

As shown in FIGS. 1A and 1B, a device isolation insulator film as designated by Reference Numerals 102 and 102A is formed on a p-type silicon substrate 101, and n⁺ diffused layers 103 and 103A are formed in a device formation region defined by the device isolation insulator film. In addition, a gate insulator film 104 for a MOS (metal-oxide-semiconductor) field effect transistor is formed to cover a surface of the substrate. Thereafter, the gate insulator film 104 is selectively etched to form a first contact hole 105. Then, a gate electrode as designated by Reference Numerals 106 and 106A is formed. Here, as shown in FIG. 1B, the gate insulator film 104 is removed within the first contact hole 105, so that the n⁺ diffused layer 103 is electrically connected to the gate electrode 106 within the first contact 103 is electrically connected to the gate electrode 106 within the first contact hole 105.

Thereafter, a first interlayer insulator film 107 is formed, and then, a first wiring conductor as designated by Reference Numerals 108 and 108A is formed. Furthermore, a second interlayer insulator film 109 is formed to cover the first wiring conductor 108 and 108A.

In order to connect the gate electrode 106 and the n⁺ diffused layer 103 to one common wiring conductor, a second contact hole 110 is formed through the first interlayer insulator film 107 and the second interlayer insulator 109. As shown in FIG. 1B, this second contact hole 110 is formed to extend over the gate electrode 106 and the n⁺ diffused layer 103, so that the second contact hole 110 becomes a common contact hole which is rectangular in a plan view.

As mentioned above, in the case of interconnecting a conductive member pattern of the semiconductor device such as the above mentioned gate electrode, and another conductive member such as the above mentioned n⁺ diffused layer, and also of connecting these two conductive members to one common wiring conductor, the formation of the common contact hole extending over these two conductive members is very effective in increasing the integration density of the semiconductor device.

However, in the prior art as mentioned above, if the design rule of the semiconductor device becomes 0.5 μm or less, the size of the common contact hole is correspondingly made to 0.5 μm or less. In this case, when a fine rectangular contact shape in a mask is transferred to a photoresist film, a completed common contact hole pattern is deformed to a barrel shape having an expanded intermediate part. Namely, as shown in FIG. 1A, the second contact hole 110 formed in the interlayer insulator film has a short side direction size which is enlarged in an intermediate part. As a result, the distance between the second contact hole 110 and another conductor pattern formed above the two conductive members, for example, a periphery 108B of the first wiring conductor 108 shown in FIG. 1A surrounding the contact hole 110, becomes short. This makes difficult the alignment between different patterns in a photolithographic process, and therefore, makes difficult the fine patterning of the semiconductor device element in this region.

The restriction of the fine patterning in the semiconductor device element due to the deformation of the contact hole, is an important problem to be solved for increasing the integration density and the integration size of the semiconductor device, when a circuit pattern is repeated in the semiconductor device as in the SRAM.

SUMMARY OF THE INVENTION

Accordingly, it is an object of the present invention to provide a semiconductor device which has overcome the above mentioned defect of the conventional one.

Another object of the present invention is to provide a common contact hole structure in a semiconductor device, having a fine pattern and a desired rectangular shape.

The above and other objects of the present invention are achieved in accordance with the present invention by a semiconductor device comprising a semiconductor substrate, an impurity diffused layer formed in a principal surface of the semiconductor substrate, a conductive member formed on the semiconductor substrate adjacent to the impurity diffused layer and having a sloped surface inclined to the principal surface of the semiconductor substrate, an insulator film deposited to cover the impurity diffused layer and the conductive member, and a common contact hole formed through the insulator film to extend over a surface of the impurity diffused layer and the sloped surface of the conductive member.

Preferably, the insulator film is formed to fulfil the relation of d=mλ/4n, where "λ" is a wavelength of an irradiating light used in a photolithographic process for patterning a photosensitive resist; "m" is a positive odd number; and "d" and "n" are a film thickness and a refractive index of the insulator film.

The above and other objects, features and advantages of the present invention will be apparent from the following description of preferred embodiments of the invention with reference to the accompanying drawings.

DESCRIPTION OF THE PREFERRED EMBODIMENTS

Figure 2A:
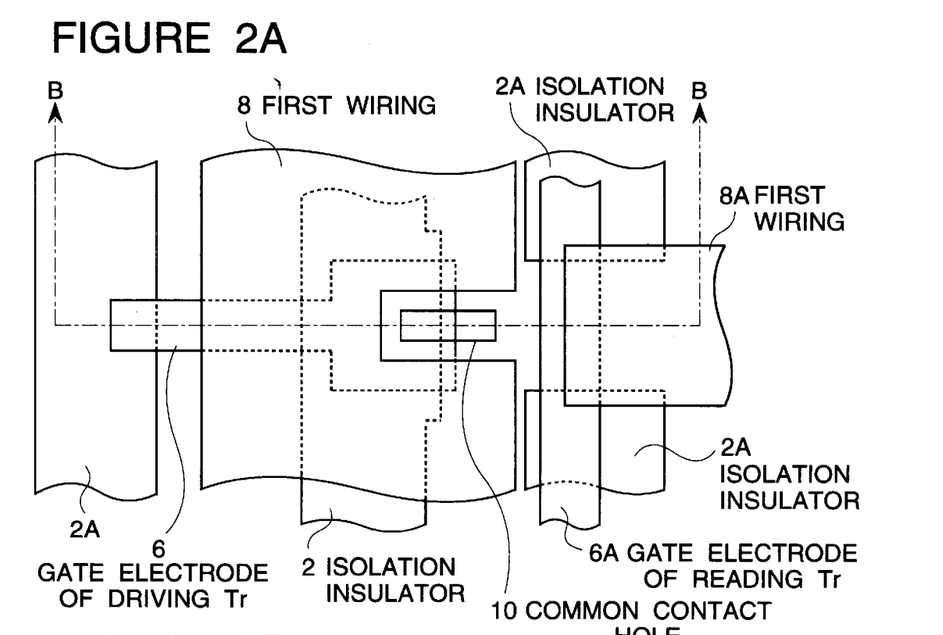
FIG. 2A is a layout pattern diagram illustrating the "common contact hole" which extends over the gate electrode pattern and the diffused layer in a first embodiment of the semiconductor device in accordance with the present invention.
Figure 2B:
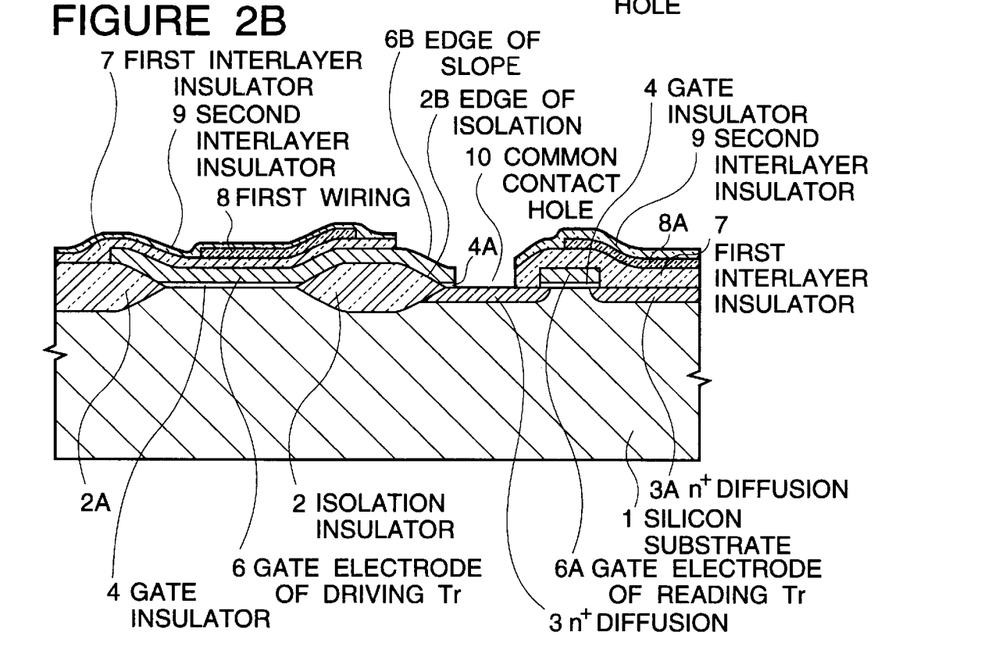
FIG. 2B is a sectional view taken along the line B—B in FIG. 2A.

Referring to FIG. 2A, there is shown a layout pattern diagram illustrating the "common contact hole" which extends over the gate electrode pattern and the diffused layer in a first embodiment of the semiconductor device in accordance with the present invention. In addition, FIG. 2B is a sectional view taken along the line B—B in FIG. 2A. For easy comparison, FIGS. 2A and 2B shows a portion similar to that shown in FIGS. 1A and 1B.

As shown in FIGS. 2A and 2B, a device isolation insulator film as designated by Reference Numerals 2 and 2A is formed on a surface of a p-type silicon substrate 1, and $n^+$ diffused layers 3 and 3A are formed in a device formation region defined by the device isolation insulator film. Here, an edge portion of the device isolation insulator film 2 is shaped to have a slope 2B. This slope can be easily formed in the device isolation insulator film formation process based on a LOCOS process or a modified LOCOS process. In addition, a gate insulator film 4 for a MOS transistor is formed to cover a surface of the substrate.

After the gate insulator film 4 is formed, a gate electrode as designated by Reference Numerals 6 and 6A is formed. Here, as shown in FIG. 2B, an inclined end portion 6B of the gate electrode 6 has a slope similar to the slope 2B of the edge portion of the device isolation insulator film 2. Here, the angle of the slope is set to be on the order o 10° to 20°.

Furthermore, the amount of the gate electrode 6 projecting from the end of the device isolation insulator film 2 is made short, and the gate insulator film 4A is interposed between the $n^+$ diffused layer 3 and the projected portion of the gate electrode 5, so that the $n^+$ diffused layer 3 is not electrically connected to the projected portion of the gate electrode 5.

Thereafter, a first interlayer insulator film 7 is formed, and then, a first wiring conductor as designated by Reference Numerals 8 and 8A is formed. Furthermore, a second interlayer insulator film 9 is formed to cover the first wiring conductor 8 and 8A.

In order to connect the gate electrode 6 and the $n^+$ diffused layer 3, formed as mentioned above, to one common wiring conductor, a common contact hole 10 is formed through the first interlayer insulator film 7 and the second interlayer insulator film 9. As shown in FIG. 2B, this common contact hole 10 is formed to extend over the gate electrode 6 and the $n^+$ diffused layer 3.

In forming this common contact hole, even if a contact hole pattern in a mask is a square, namely if a mask projected pattern of the contact hole is a square in the photolithography, the shape of a completed contact hole becomes an elongated rectangle, as shown in FIG. 2A. On the other hand, the phenomenon in the prior art in which the short side direction size of the rectangular contact hole is enlarged in an intermediate part can be prevented.

Figure 3A:
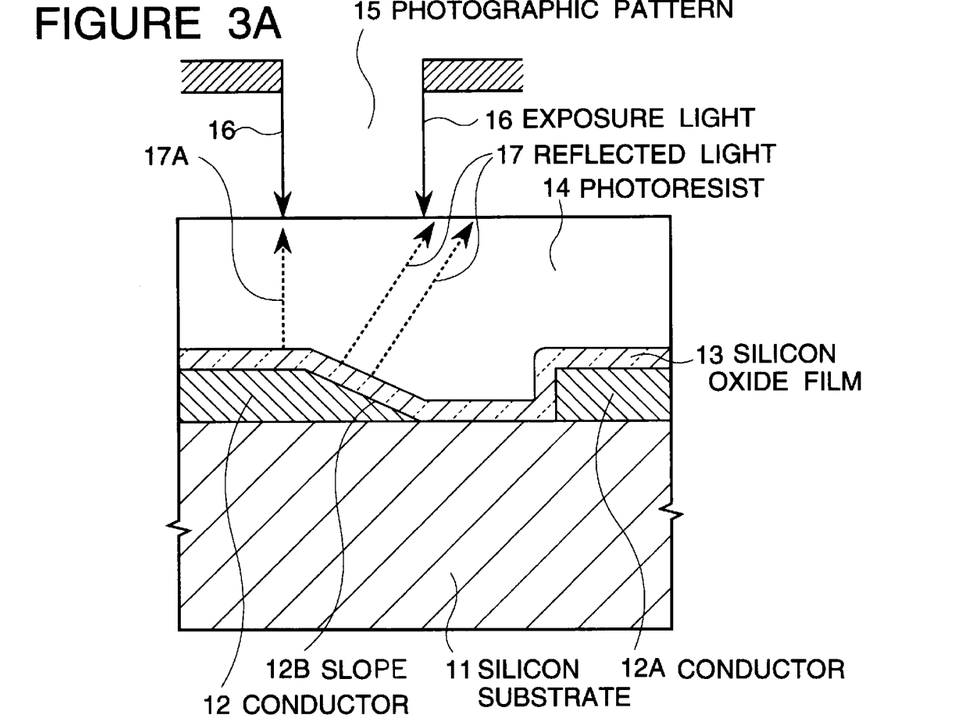
FIGS. 3A and 3B illustrate a light exposure performed in the course of manufacturing the semiconductor device shown in FIG. 2A.
Figure 3B:
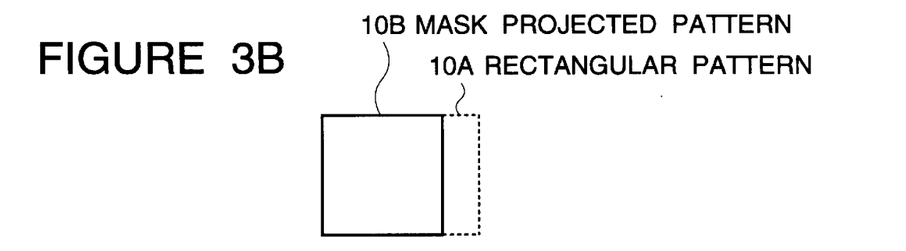

Now, the advantage of the present invention will be explained with reference to FIGS. 3A, 3B and 4. FIGS. 3A and 3B diagrammatically illustrate a light exposure in the photolithographic process. Here, it is assumed that a subject to be exposed is as follows: As shown in FIG. 3A, on a silicon substrate 11 there is formed a conductive member 12 and 12A having a high reflectance factor such as a refractory metal (for example, W, Mo, Ti, Ta, and Co) and a refractory metal silicide, and in addition, a sloped surface 12B is formed at an edge portion of the conductive member 12. A silicon oxide film 13 is formed to cover the substrate surface including the conductive member 12 and 12A. Then, a photoresist film 14 is coated to cover the whole. Here, the silicon oxide film 13 may be replaced with another transparent insulative film, for example, a silicon nitride film.

An exposure light is projected through a photographic mask pattern 15 to the subjected to be exposed constituted as mentioned above. If an underlying layer of the photoresist film 14 has a high reflectance factor, a reflected light indicated by Reference Numerals 17 and 17A occurs. Here, in an area in which the underlying layer, namely, the conductive member 12 is horizontal, most of the reflected light becomes the reflected light 17A which propagates in a direction opposite to that of an incident light, so that a standing wave is formed. However, the slope or inclined surface 12B causes the reflected light 17 which propagates in a direction inclined to that of the incident light so that an area of the photoresist film 14 larger than the mask pattern 15 is exposed.

With this phenomenon, as shown in FIG. 3B, the square projected pattern 10B of the mask pattern 15 is deformed into an elongated rectangular pattern 10A. Here, if the photoresist film 14 is a positive photoresist, the elongated rectangular contact hole is formed.

The strength of the reflected light depends upon the reflectance factor of the conductive member 12 and the film thickness of the silicon oxide film 13. Namely, the strength of the reflected light can be controlled by changing the film thickness of the transparent silicon oxide film 13 covering the conductive member 12.

Figure 4:
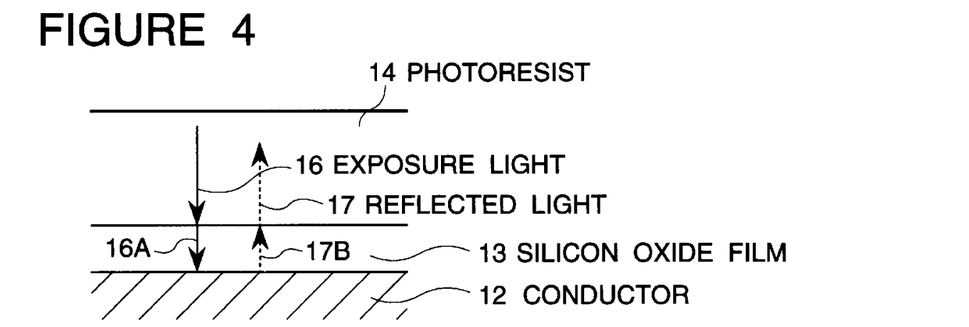
FIG. 4 also illustrates a light exposure performed in the course of manufacturing the semiconductor device shown in FIG. 2A.

FIG. 4 diagrammatically illustrates a case in which light is irradiated onto a sample having the silicon oxide film 13 formed to cover the conductive member 12 and the photoresist film 14 deposited to cover the silicon oxide film 13. After the exposure light 16 injects into the photoresist film 14, some portion 16A of the incident light passes through the silicon oxide film 13, and another portion of the incident light is reflected by a boundary between the silicon oxide film 13 and the photoresist film 14, so that the reflected light occurs. Here, since the refractive index of the photoresist film is on the order of 1.7, and on the other hand, the refractive index of the silicon oxide film is on the order of 1.45, the phase of the reflected light 17 does not change. However, the incident light 16A passing through the silicon oxide film 13, is reflected by the surface of the conductive member 12, so that the reflected light 17B occurs, which is shifted in phase by 180°.

Therefore, assuming that the film thickness of the silicon oxide film 13 is "d", the refractive index of the silicon oxide film 13 is "n", the wave length of the exposure light 16 is "λ", and "m" is a positive odd number, when the film thickness of the silicon oxide film 13 fulfil the following equation:

$$d = m\lambda/4n \quad (1)$$

the reflected lights 17 and 17B interfere to enhance the light strength, so that the strength of the reflect light becomes maximum.

For example, when the exposure light is "i" line, since the wave length is 365 nm, the strength of the reflect light becomes maximum when the film thickness of the silicon oxide film is about 63 nm.

Therefore, the film thickness of the silicon oxide film 13 shown in FIG. 3A is set to fulfil the above mentioned equation (1), so that the strength of the reflect light becomes large. In the example shown in FIG. 3A, the angle between the exposure light 16 and a normal line perpendicular to the inclined surface 12B is on the order of 20°. Accordingly, the film thickness of the silicon oxide film which actually maximizes the reflected light strength, is smaller than the value obtained from the equation (1), by about 5%. However, this is in a tolerance range.

Figure 5A:
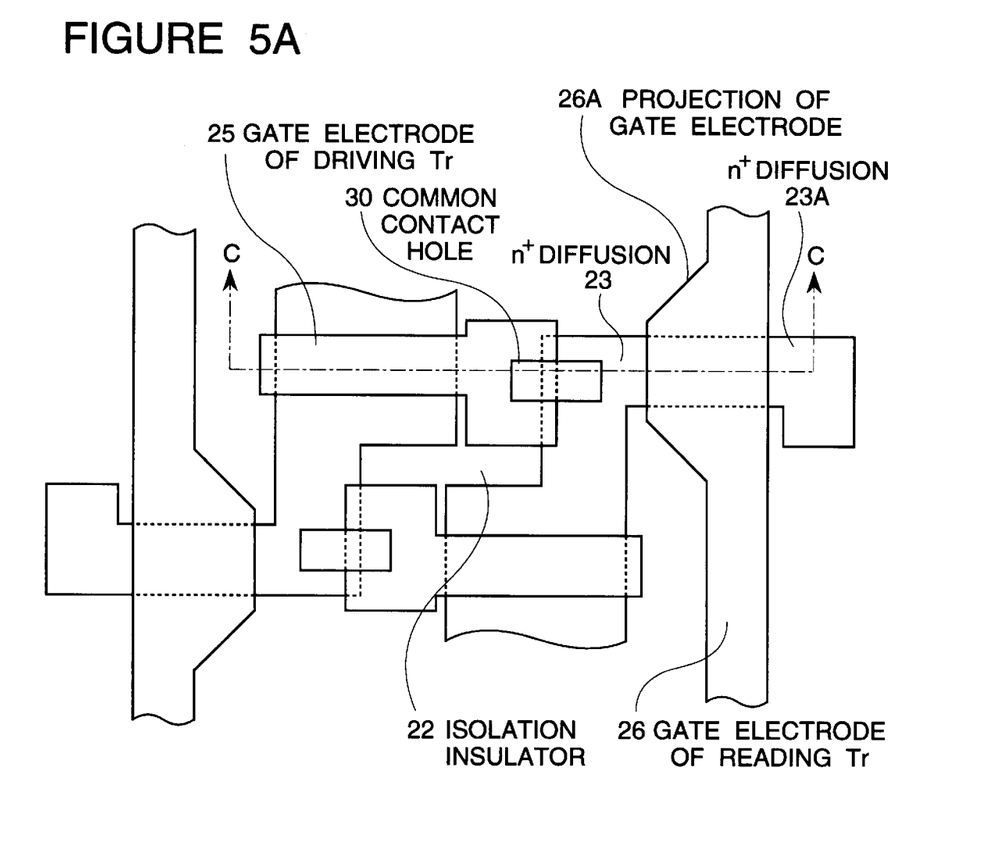
FIG. 5A is a layout pattern diagram illustrating the "common contact hole" which extends over the gate electrode pattern and the diffused layer in a second embodiment of the semiconductor device in accordance with the present invention.
Figure 5B:
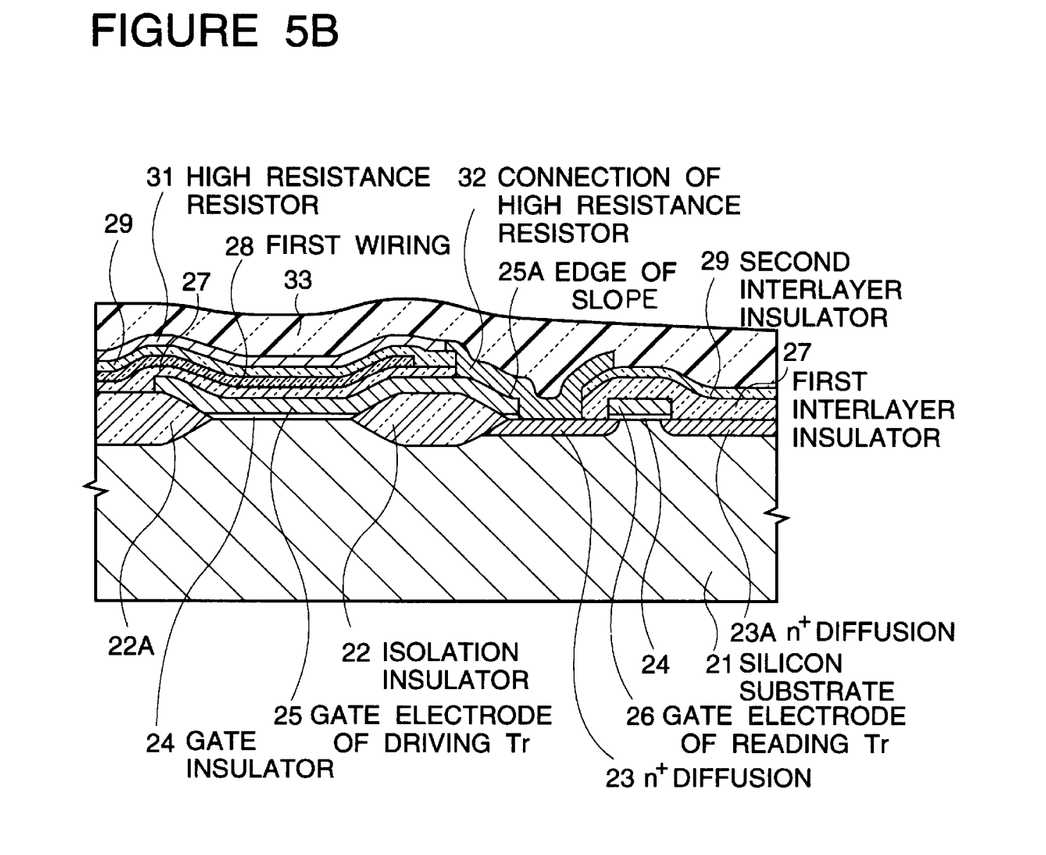
FIG. 5B is a sectional view taken along the line C—C in FIG. 5A.

Now, a second embodiment of the semiconductor device will be explained with FIGS. 5A and 5B, which illustrate a memory cell of one bit in the SRAM in accordance with the present invention. FIG. 5A is a layout pattern diagram illustrating the "common contact hole" which extends over the gate electrode pattern and the diffused layer in the SRAM in accordance with the present invention. FIG. 5B is a sectional view taken along the line C—C in FIG. 5A.

As shown in FIGS. 5A and 5B, a device isolation insulator film as designated by Reference Numerals 22 and 22A is formed on a surface of a p-type silicon substrate 21, and $n^+$ diffused layers 23 and 23A are formed in a device formation region defined by the device isolation insulator film. An edge portion of the device isolation insulator film 22 is inclined as already explained with reference to FIG. 2B. This inclined surface can be easily formed in the device isolation insulator film formation process based on a LOCOS process or a modified LOCOS process. In addition, a gate insulator film 24 for a MOS transistor is formed of a silicon oxide film.

After the gate insulator film 24 is formed, a gate electrode 25 for a driving transistor and a gate electrode 26 for a reading transistor are formed. In the shown embodiment, as shown in FIG. 5A, the gate electrode 26 for the reading transistor expands its width in an area adjacent to the $n^+$ diffused layer 23, so that the gate electrode 26 has a projected portion 26A. Incidentally, as already explained in connection with the first embodiment, an end portion of the gate electrode 25 for the driving transistor has an inclined surface 25A similar to the inclined end portion of the device isolation insulator film.

Thereafter, a first interlayer insulator film 27 is formed, which is formed of for example a silicon oxide film or a BPSG (borophosphosilicate glass). Then, a first wiring conductor 28 is formed on the first interlayer insulator film 27. Furthermore, a second interlayer insulator film 29 is formed to cover the first wiring conductor 28. This second interlayer insulator film 29 is formed of a silicon oxide film.

In order to connect the gate electrode 25 of the driving transistor and the $n^+$ diffused layer 23 formed as mentioned above, to one common high-resistance wiring conductor, a common contact hole 30 is formed through the first interlayer insulator film 27 and the second interlayer insulator film 29. As shown in FIGS. 5A and 5B, this common contact hole 30 is formed to extend over the inclined end portion 25B of the gate electrode 25 of the driving transistor and the $n^+$ diffused layer 23.

Then, a high resistance resistor 31 is formed to constitute a load part of the SRAM memory cell. In addition, arsenic or phosphorus is doped into a region of the high resistance resistor 31 covering the common contact hole 30, so that a high resistance resistor connection part 32 is formed.

Thus, the high resistance resistor 31, the $n^+$ diffused layer 23 and the gate electrode 25 of the driving transistor are electrically interconnected by the common contact hole 30.

Thereafter, a third interlayer insulating film 33 is formed, and then, a second electrode/wiring conductor (not shown) is formed. Thus, a basic structure of the SRAM memory is completed.

An advantage obtained by applying the present invention to the SRAM memory cell will be explained with reference to FIG. 6.

Figure 6:
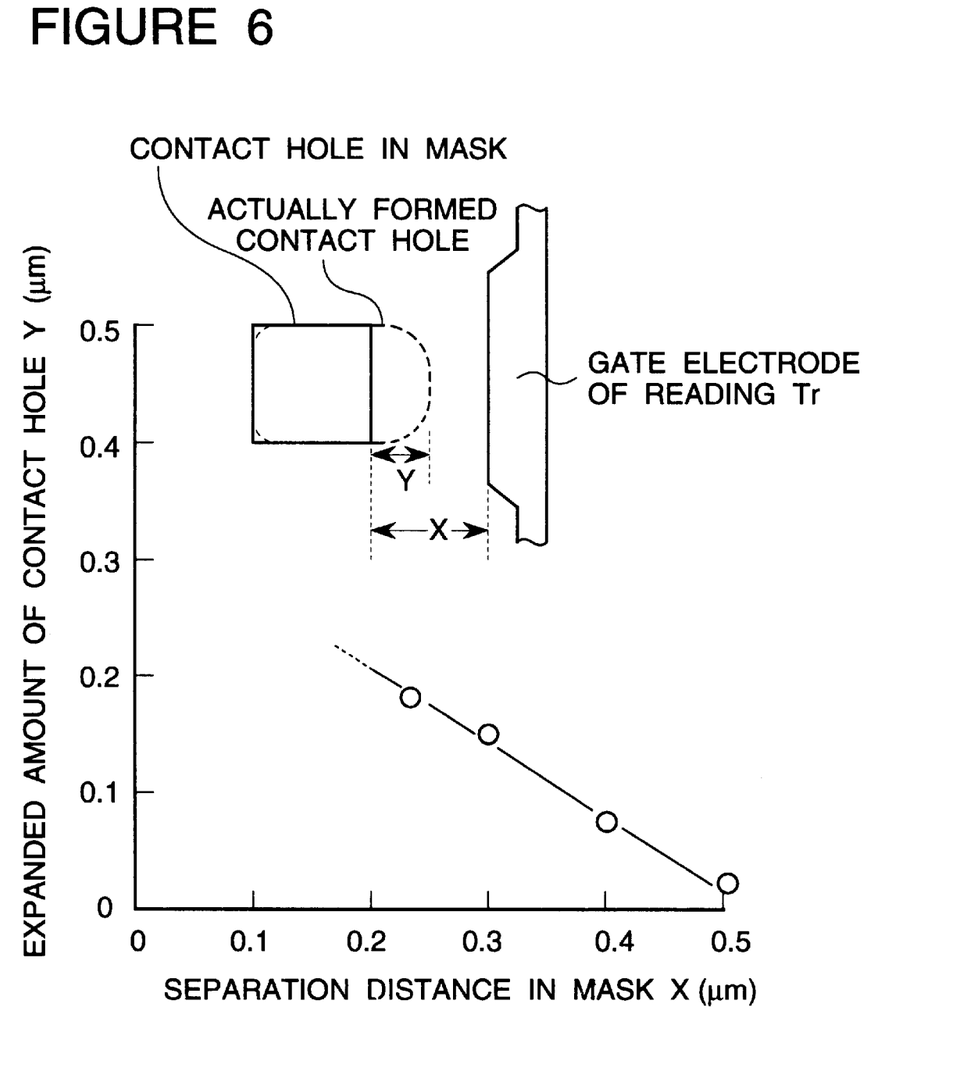
FIG. 6 is a graph illustrating an advantage of the second embodiment of the semiconductor device in accordance with the present invention.

As shown in a pattern diagram added in FIG. 6, the axis of abscissas in the graph of FIG. 6 indicates a distance between the contact hole and the gate electrode of the reading transistor in the mask design, and the axis of ordinates shows the expanded amount of the contact hole size in the completed contact hole. Incidentally, the above mentioned separation distance can be changed by changing the projection amount of the projected part 26A of the gate electrode of the reading transistor.

As seen from FIG. 6, if the separation distance becomes small, the expanded amount of the contact hole size increases. Specifically, if the exposure light is the "i" line, if the separation distance in the mask becomes 0.5 μm or less, the increase of the expanded amount of the contact hole size becomes remarkable, and if the separation distance in the mask becomes 0.2 μm or less, the increase of the expanded amount of the contact hole size becomes comparable to the separation distance, namely, about 0.2 μm.

Therefore, if the expanded amount of the contact hole size becomes larger than the separation distance in the mask, in order to prevent the contact hole from being formed on the gate electrode of the reading transistor, it is necessary to previously coat the gate electrode of the reading transistor by an insulator of the kind different from that of the first interlayer insulator film 27.

The reason for the fact that, as mentioned above, the smaller the separation distance becomes, the larger the expanded amount of the contact hole size becomes, is considered to be that the film thickness of the photoresist film becomes equal in common contact hole forming region, and therefore, the effect of the present invention increases. On the other hand, if the projection amount of the projected part 26A of the gate electrode is made small so as to increase the separation distance, the film thickness of the photoresist film formed between the gate electrode 25 of the driving transistor and the gate electrode 26 of the reading transistor becomes unequal, so that the effect of the present invention decreases.

Now, explanation will be made regarding a process for manufacturing a semiconductor device in accordance with the present invention, with reference to FIGS. 7A to 7F, which the diagrammatic sectional views illustrating a process for manufacturing the semiconductor device in accordance with the present invention.

Figure 7A:
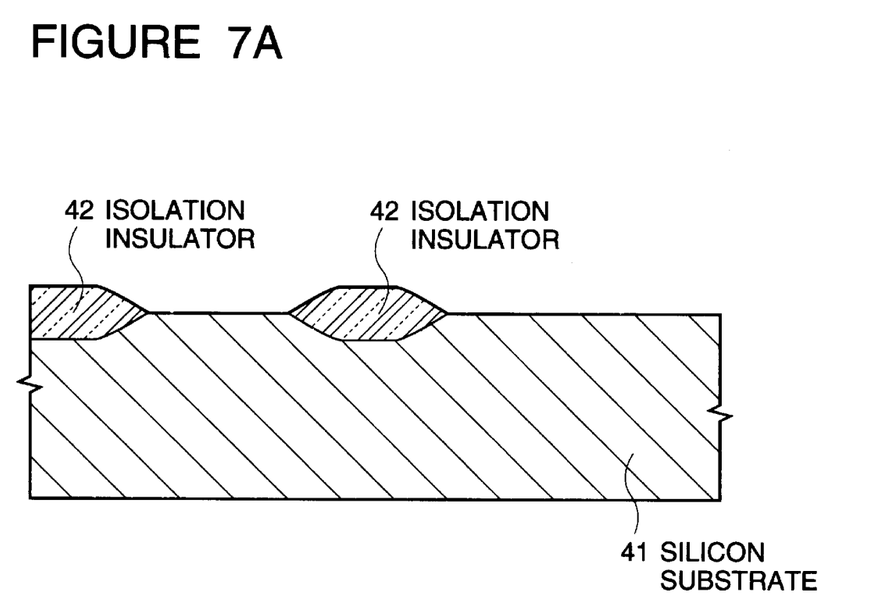
FIGS. 7A to 7F are diagrammatic sectional views illustrating a process for manufacturing the second embodiment of the semiconductor device in accordance with the present invention.

As shown in FIG. 7A, a surface of a silicon substrate 41 is selectively thermally oxidized so that a device isolation insulator film 42 is formed. In the shown embodiment, the thickness of the device isolation insulator film 42 is on the order of 400 nm.

Figure 7B:
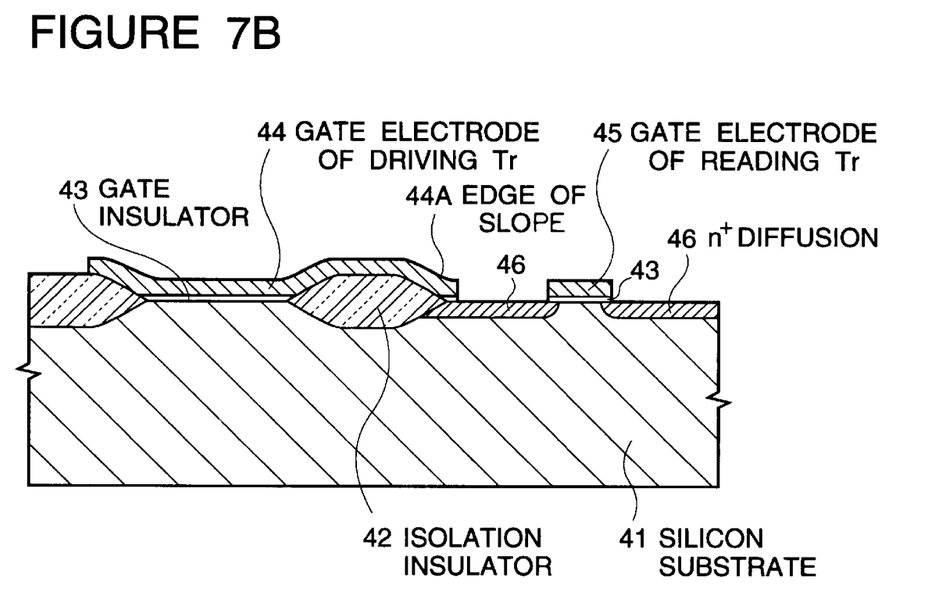

Next, as shown in FIG. 7B, a gate insulator film 43 is formed. This gate insulator film 43 is for example a silicon oxide film having a thickness of 10 nm, which is formed by thermal oxidation. Furthermore, a conductive polysilicon film having a thickness of 100 nm and a tungsten silicide film having a thickness of 100 nm are deposited and stacked. Thereafter, the stacked conductor layers are patterned by a known patterning technique so that a gate electrode 44 of a driving transistor and a gate electrode of a reading transistor 45 are formed as shown in FIG. 7B. Then, arsenic is ion-implanted to the whole surface of the substrate, and a thermal treatment is performed so as to form an $n^+$ diffused layer 46.

Figure 7C:
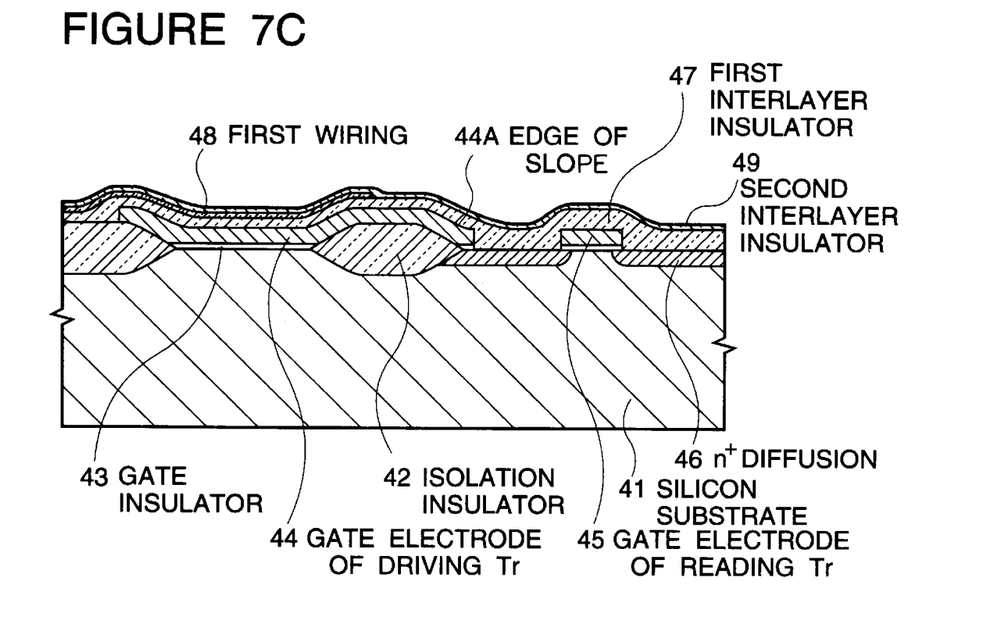

As shown in FIG. 7C, a thin silicon oxide film and a BPSG film are deposited and stacked by a CVD (chemical vapor deposition) process. A thermal treatment is carried out, so as to reflow the BPSG film and to planarize a surface of the BPSG film. Thus, a first interlayer insulator film 47 is formed. Then, a tungsten film having a thickness of 100 nm is deposited on the first interlayer insulator film 47 by the CVD process, and then, patterned to form a first electrode/wiring conductor 48. Furthermore, a second interlayer insulator film 49 is formed to cover the first electrode/wiring conductor 48. This second interlayer insulator film 49 is formed of a silicon oxide film having a thickness of 100 nm which is deposited by the CVD process.

Here, a total thickness of the first interlayer insulator film 47 and the second interlayer insulator film 49, which cover an inclined end surface 44A of the gate electrode 44 of the driving transistor, is so set as to maximize the reflected light strength of the exposure light as mentioned in connection with the first embodiment.

Figure 7D:
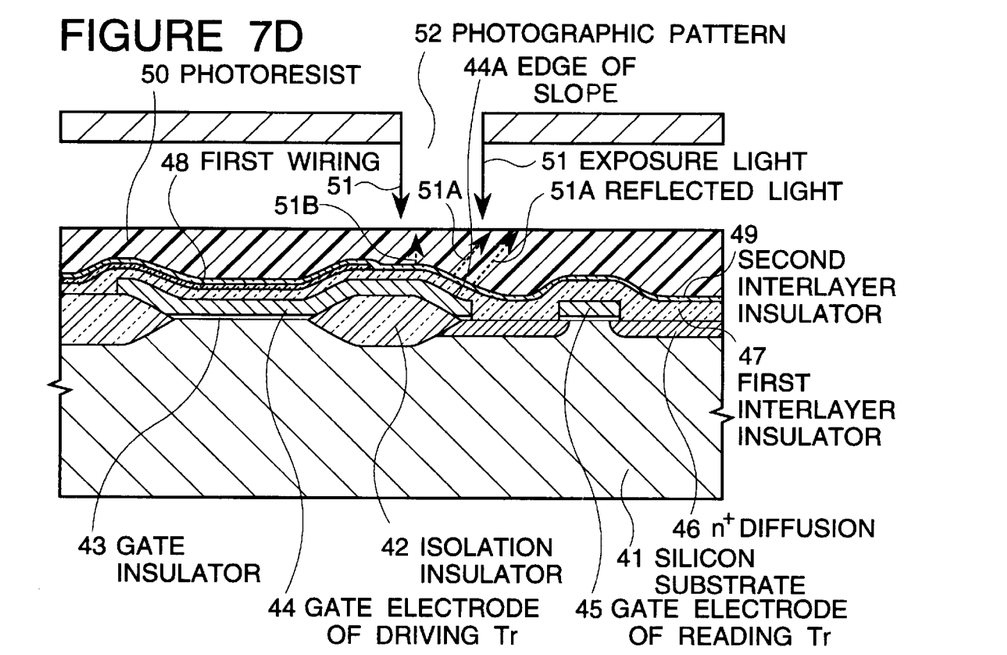
Figure 7E:
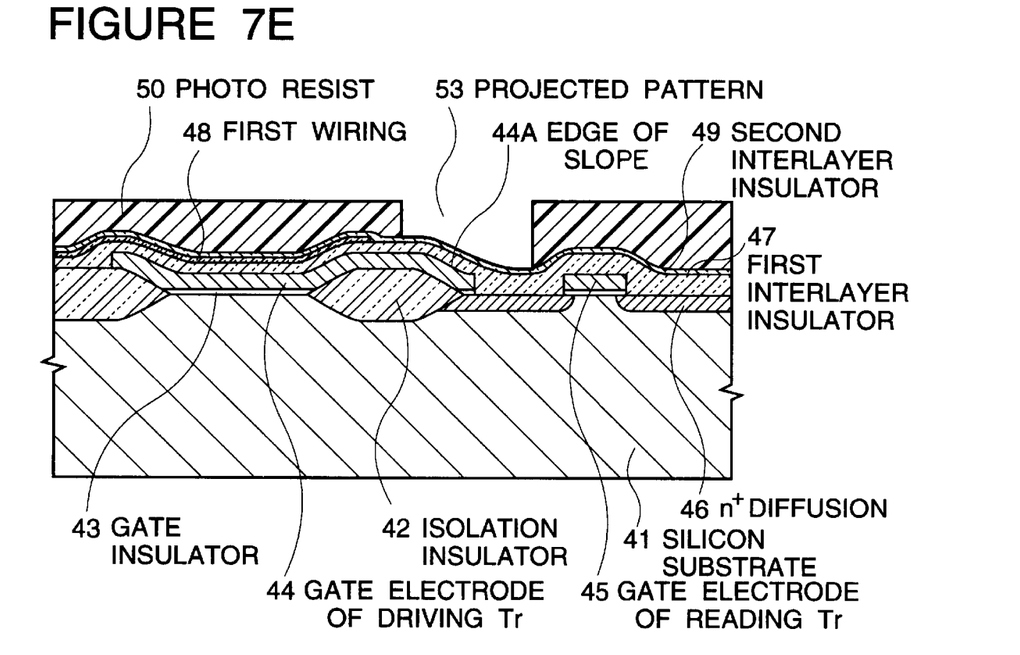

Thereafter, as shown in FIG. 7D, a positive photoresist film 50 is deposited on the second interlayer insulator film 49. Then, an exposure light 51 is irradiated through a photographic pattern 52 onto the photoresist film 50 by use of an "i" line stepper. In this exposure process, the light injected onto the inclined end surface 44A of the gate electrode 44 of the driving transistor is reflected in an oblique direction, so that an inclined reflected light 51A occurs. On the other hand, a vertical reflected light 51B is generated by a horizontal plannar region of the gate electrode 44 of the driving transistor. Then, the photoresist film 50 thus exposed is developed by a know method, so that a projected pattern 53 is formed in the photoresist film 50 as shown in FIG. 7E. The projected pattern 53 is larger than the photographic pattern 52, since the irradiated region of the photoresist film 50 is expanded by the inclined reflected light 51A.

Figure 7F:
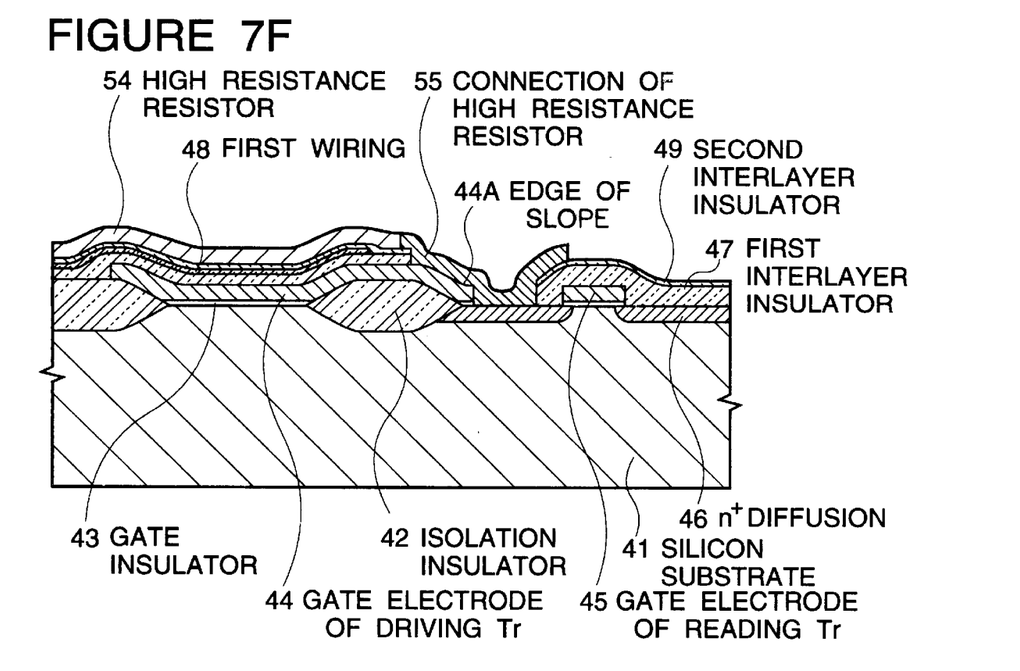

Thereafter, as shown in FIG. 7F, by using the patterned photoresist film 50 as an etching mask, the first interlayer insulator film 47 and the second interlayer insulator film 49 are selectively dry-etched, so as to form a common contact hole.

Thereafter, a high resistance resistor 54 is formed, and a high resistance resistor connection part 55 is formed in the common contact hole region. Here, the high resistance resistor 54 is formed of a polysilicon film containing 20% to 30% of oxygen atoms. The high resistance resistor connection part 55 is formed by doping arsenic or phosphorus into a portion of the above mentioned polysilicon film (containing the oxygen atoms) within the common contact region, by an ion-implantation process.

In the above mentioned embodiments, the impurity diffused layer is of the "n" type. However, the present invention can be equally applied to a semiconductor device in which the impurity diffused layer is of the "p" type.

As mentioned above, in a semiconductor device in accordance with the present invention, the conductive member having the inclined surface is provided under a portion of the interlayer insulator film where a contact hole is to be formed. A transparent insulator film is deposited on the inclined surface of the conductive member, in order that, when the exposure light is irradiated to the inclined surface of the conductive member, the reflected light from the inclined surface is strengthened. After the above mentioned underlying layer structure is formed, a contact hole is formed on the interlayer insulator film positioned above the inclined surface of the conductive member.

Thus, in the photolithography process, it is possible to easily carry out a pattern projection which deforms the mask pattern into a desired rectangular shape, and in addition, the control of the shape of the contact hole can be simplified. Furthermore, by controlling the projected pattern of the contact hole, it is possible to greatly improve the precision in aligning the contact hole pattern and the underlying semiconductor device pattern in the photolithography process.

In addition, with this improved alignment precision, it is possible to easily realize the increase of the integration density and the integration scale. If the present invention is applied to an SRAM memory which has a complicated memory cell structure and which requires a fine patterning, it is possible to facilitate the increase of the integration density and the integration scale.

The invention has thus been shown and described with reference to the specific embodiments. However, it should be noted that the present invention is in no way limited to the details of the illustrated structures but changes and modifications may be made within the scope of the appended claims.

We claim:

1. A semiconductor device comprising a semiconductor substrate, an impurity diffused layer in a principal surface of said semiconductor substrate, a conductive member formed on said semiconductor substrate adjacent to said impurity diffused layer and having a sloped surface inclined to said principal surface of said semiconductor substrate, an insulator film deposited to cover said impurity diffused layer and said conductive member, and a common contact hole formed through said insulator film to extend over a surface of said impurity diffused layer and said sloped surface of said conductive member, said insulator film having a thickness d such that $d=m\lambda/4n$, where $\lambda$ is a wavelength of an irradiating light used in a photolithographic process for patterning a photosensitive resist used in formation of said common contact hole, m is a positive odd number, and n is a refractive index of said insulator film.

2. A semiconductor device as claimed in claim 1, wherein said conductive member has a reflectance factor, and said insulator film is transparent to light having said wavelength $\lambda$.

3. A semiconductor device as claimed in claim 2, wherein said conductive member is formed of one of a refractory metal and a refractory metal silicide, and wherein said insulator film is formed of one of a silicon oxide film and a silicon nitride film.

4. A semiconductor device claimed in claim 2 wherein said sloped surface of said conductive member is on the order of 10° to 20°.

5. A semiconductor device comprising a semiconductor substrate, an impurity diffused layer in a principal surface of said semiconductor substrate, a conductive member formed on said semiconductor substrate adjacent to said impurity diffused layer and having a sloped surface inclined to said principal surface of said semiconductor substrate, an insulator film deposited to cover said impurity diffused layer and said conductive member, and a common contact hole formed through said insulator film to extend over a surface of said impurity diffused layer and said sloped surface of said conductive member, said insulator film having a thickness d such that $d=m\lambda/4n$, where $\lambda$ is a wavelength of an irradiating light used in a photolithographic process for patterning a photosensitive resist for formation of said common contact hole, m is a positive odd number, and n is a refractive index of said insulator film, wherein said insulator layer is a silicon oxide layer and said wavelength $\lambda$ of an irradiating light is 365 nm.

6. A semiconductor device comprising a semiconductor substrate, an impurity diffused layer in a principal surface of said semiconductor substrate, a conductive member formed on said semiconductor substrate adjacent to said impurity diffused layer and having a sloped surface inclined to said principal surface of said semiconductor substrate, an insulator film deposited to cover said impurity diffused layer and said conductive member, and a common contact hole formed through said insulator film to extend over a surface of said impurity diffused layer and said sloped surface of said conductive member, said insulator film having a thickness d such that $d=m\lambda/4n$, where $\lambda$ is a wavelength of an irradiating light used in a photolithographic process for patterning a photosensitive resist used to form said contact hole, m is a positive odd number, and n is a refractive index of said insulator film, wherein said insulator layer is a silicon oxide layer having a thickness of about 63 nm, and wherein said wavelength $\lambda$ of irradiating light is 365 nm.

* * * * *